(12) United States Patent
Wu et al.

(10) Patent No.: US 12,117,860 B2
(45) Date of Patent: Oct. 15, 2024

(54) SYSTEM AND METHOD FOR A LOW VOLTAGE SUPPLY BANDGAP

(71) Applicant: Taiwan Semiconductor Manufacturing Company, Ltd., Hsinchu (TW)

(72) Inventors: Min-Shin Wu, Taipei (TW); Shao-Yu Chou, Chu Pei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 18/169,568

(22) Filed: Feb. 15, 2023

(65) Prior Publication Data

US 2024/0111323 A1 Apr. 4, 2024

Related U.S. Application Data

(60) Provisional application No. 63/412,737, filed on Oct. 3, 2022.

(51) Int. Cl.
*G05F 3/26* (2006.01)
*H03F 3/45* (2006.01)

(52) U.S. Cl.
CPC ......... *G05F 3/267* (2013.01); *H03F 3/45179* (2013.01); *H03F 2200/447* (2013.01)

(58) Field of Classification Search
CPC ... G05F 3/30; G05F 3/267; G05F 1/46; G05F 3/225; G05F 1/10; G05F 1/468;
(Continued)

(56) References Cited

U.S. PATENT DOCUMENTS 6,362,612 B1 * 3/2002 Harris .................. G05F 3/30
323/314
7,834,611 B2 * 11/2010 Kim ..................... G11C 5/147
323/317

(Continued)

FOREIGN PATENT DOCUMENTS

| TW | 200941184 A | 10/2009 |
| TW | 201135397 A | 10/2011 |
| TW | 201144971 A | 12/2011 |

OTHER PUBLICATIONS

Office Action issued in connection with Taiwan Appl. No. 112126800 dated May 27, 2024.

*Primary Examiner* — Lincoln D Donovan
*Assistant Examiner* — Tyler J Pereny
(74) *Attorney, Agent, or Firm* — FOLEY & LARDNER LLP

(57) ABSTRACT

In some aspects of the present disclosure, a bandgap reference circuit includes a first current mirror and a first resistor coupled to the first current mirror to provide a proportional to absolute temperature (PTAT) voltage. The circuit includes a second current mirror and a bipolar junction transistor (BJT) device coupled to the second current mirror to provide a complementary to the absolute temperature (CTAT) voltage. The circuit includes an output node to provide a bandgap voltage that is a weighted sum of the PTAT voltage and the CTAT voltage. The circuit includes a second resistor coupled between the output node and a first node, wherein the first node is coupled between the first resistor and the first current mirror. The circuit includes a third resistor coupled between the output node and a second node, wherein the second node is coupled between the BJT device and the second current mirror.

19 Claims, 5 Drawing Sheets

(58) Field of Classification Search
CPC ... G05F 1/59; G05F 3/222; G05F 3/02; G05F 3/16; G05F 3/26; G05F 3/262; G05F 3/265; H03F 2200/447; H03F 2200/456; H03F 2203/45564; H03F 3/45179; H03F 3/45475; H03F 3/45928
See application file for complete search history.

(56) References Cited

U.S. PATENT DOCUMENTS

| | | | | |
|---|---|---|---|---|
| 2005/0231270 | A1* | 10/2005 | Washburn | G05F 3/30 327/539 |
| 2007/0152740 | A1* | 7/2007 | Georgescu | G05F 3/30 327/539 |
| 2008/0001661 | A1* | 1/2008 | Tachibana | H03F 3/45475 330/253 |
| 2021/0041928 | A1 | 2/2021 | Eberlein | |

* cited by examiner

SYSTEM AND METHOD FOR A LOW VOLTAGE SUPPLY BANDGAP

CROSS-REFERENCE TO RELATED APPLICATIONS

This application claims priority to and the benefit of U.S. Provisional Patent App. No. 63/412,737, filed Oct. 3, 2022, the entire disclosure of which is incorporated herein by reference.

BACKGROUND

As semiconductor technology has advanced, transistor gate lengths, and the corresponding maximum supply voltage that the transistor can tolerate without breaking down, have become lower. Bandgap reference circuits are circuits that provide a voltage with a predetermined bandgap temperature coefficient. Bandgap reference circuit operation can be affected by the supply voltage coupled to the bandgap reference circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Like reference numbers and designations in the various drawings indicate like elements.

DETAILED DESCRIPTION

Figure 1:
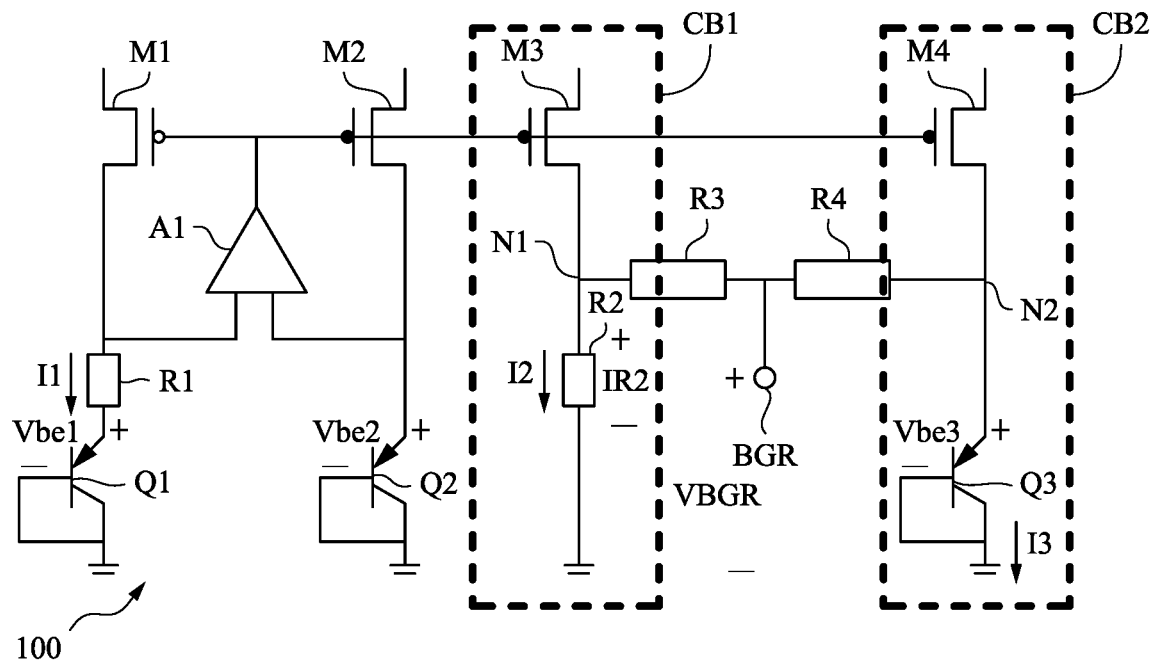
FIG. 1 illustrates a bandgap voltage reference circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A bandgap reference circuit provides a reference voltage that is steady over manufacturing process, temperature, or the supply voltage (PVT). Specifically, a bandgap reference circuit is designed to output the reference voltage within some tolerance, regardless of variations in PVT. The variation across PVT can be characterized by a number of bandgap coefficients such as a bandgap temperature coefficient. As semiconductor technology has advanced, transistor gate lengths, and the corresponding maximum supply voltage that the transistor can tolerate without breaking down, have become lower.

Disclosed herein is a bandgap circuit, system, and method that can provide a bandgap reference voltage robust across PVT. Embodiments of the bandgap circuit, system, and method include separate current branches that provide a proportional to absolute temperature (PTAT) voltage and a complementary to the absolute temperature (CTAT) voltage, respectively. Embodiments of the bandgap circuit, system, and method include a resistive output that provides a weighted sum of the PTAT and CTAT voltages. Advantageously, embodiments of the bandgap circuit, system, and method provide enough voltage headroom for low supply voltage systems such that the bandgap circuit provides an acceptable bandgap coefficient. Embodiments of the bandgap circuit, system, and method can be designed for advanced semiconductor technology nodes.

FIG. 1 illustrates a bandgap reference circuit 100, in accordance with some embodiments of the present disclosure. The bandgap reference circuit 100 includes two bipolar junction transistors (BJTs), Q1 and Q2. In some embodiments, Q1 and Q2 are PNP BJTs. The area (e.g., emitter area) of Q1 is n times a unit area and the area of Q2 is m times the unit area. Thus, the area of Q1 is n/m times larger than that of Q2. The base terminals and collector terminals of Q1 and Q2 are connected to the ground to make Q1 and Q2 form diode connections.

The bandgap reference circuit 100 includes an amplifier (e.g., an operational amplifier) A1. The amplifier A1 provides a bias voltage. In some embodiments, the amplifier A1 is a two-stage operational amplifier. The two stages may include a differential amplifier stage, followed by a voltage gain amplifier. The two-stage operational amplifier has an advantage of consuming less power. In some embodiments, the amplifier A1 is a three-stage operational amplifier. The three stages may include the above stages, followed by a buffer stage that provides a gain to the current. The three-stage operational amplifier has an advantage of being able to drive a resistive load. The operational amplifier A1 can be implemented using metal oxide semiconductor field effect transistor (MOSFET) devices.

The emitter terminal of Q2 is connected to a negative input terminal of the operational amplifier A1. The bandgap reference circuit 100 includes a first resistor R1. The first resistor R1 is connected between the emitter terminal of Q1 and a positive input terminal of the operational amplifier A1. The bandgap reference circuit 100 includes MOSFET devices M1 and M2. In some embodiments, M1 and M2 are p-type metal oxide semiconductor (PMOS) MOSFET devices. An output terminal of the operation amplifier A1 is connected to the gate terminals of M1 and M2 while the positive input terminal of the operation amplifier A1 is connected to the drain terminal of M1 and the negative input terminal of the operation amplifier A1 is connected to the drain terminal of M2.

The bandgap reference circuit 100 includes a MOSFET device M3 having a gate terminal coupled to the output terminal of the operation amplifier A1 to receive the bias voltage and provide a first current and a MOSFET device M4 having a gate terminal coupled to the output terminal of the operation amplifier A1 to receive the bias voltage and provide a second current. The sources of M3 and M4 are coupled to a supply voltage ($V_{DD}$). Each of the MOSFET devices M3 and M4 can be referred to as a current mirror. In some embodiments, M1, M2, M3, and M4 have the same aspect ratio. The aspect ratio may be understood as a ratio of gate width of a MOSFET and a gate length of a MOSFET, a.k.a., W/L.

The bandgap reference circuit 100 includes a resistor R2. One terminal (e.g., port, end, etc.) of the resistor R2 is coupled to a drain terminal of the MOSFET device M3 to receive the first current and provide a proportional to absolute temperature (PTAT) voltage. A node at which the terminal of the resistor R2 is coupled to the drain terminal of the MOSFET device M3 can be referred to as N1. A second terminal of the resistor R2 is coupled to ground. The MOSFET device M3 and the resistor R2 can be collectively referred to as the first current branch CB1.

The bandgap reference circuit 100 includes a BJT Q3. An emitter terminal of the BJT Q3 is coupled to the drain terminal of the MOSFET device M4 to receive the second current and provide a complementary to the absolute temperature (CTAT) voltage. A node at which the emitter terminal of the BJT Q3 is coupled the drain terminal of the MOSFET device M4 can be referred to as N2. In some embodiments, the area of Q1 is at least two times as large as the area of Q3, at least three times as large as the area of Q3, or any other function of the area of Q3 without departing from the scope of the present disclosure. The area (e.g., emitter area) of Q3 is p times the unit area. Thus, the area of Q1 is n/p times larger than that of Q3. In some embodiments, an area of the BJT Q1 is at least two times as large as an area of the first BJT Q3. In some embodiments, the area of Q3 is same or substantially similar to the area of Q2. Substantially similar can be understood herein to mean within plus or minus five percent. The MOSFET device M4 and the BJT Q3 can be collectively referred to as a second current branch CB2.

The bandgap reference circuit 100 includes a pair of resistors R3 and R4. One terminal of the resistor R3 is coupled to the first node N1. One terminal of the resistor R4 is coupled to the second node N2 and a second terminal of the resistor R3 is coupled to a second terminal of the resistor R4. In some embodiments, a ratio of the resistance of the resistor R3 and the resistance of the resistor R2 is greater than ten. In some embodiments, a ratio of the resistance of the resistor R3 and the resistance of the resistor R2 is between ten and one. In some embodiments, a ratio of the resistance of the resistor R3 and the resistance of the resistor R2 is one or substantially near one. Any of other various ratios of the resistance of R3 and the resistance of R2 are within the scope of the present disclosure.

A node at which the second terminal of the resistor R3 is coupled to the second terminal of the resistor R4 can be referred to as BGR, the output node, or the output node BGR. The output node BGR provides a bandgap voltage. In some embodiments, the bandgap voltage that is provided by BGR is a weighted sum of the PTAT and CTAT voltages. In some embodiments, the bandgap voltage is less than 1V, less than 750 mV, less than 500 mV, or some other range of values while remaining within the scope of the present disclosure. In some embodiments, the bandgap voltage has a temperature coefficient less than 1000 parts-per-million (ppm) per degree Celsius, less than 500 ppm per degree Celsius, less than 100 ppm per degree Celsius, or some other range of values while remaining within the scope of the present disclosure.

The operation of the bandgap reference circuit 100 is as follows. The voltages at the input terminals of the operational amplifier A1 are generated based on the gain of the operational amplifier A1 and the feedback through the MOSFET devices M1 and M2. The current I1 is generated based on the voltage drop from the input of the operational amplifier A1 and ground. The relationship between I1 and the components coupled between the operational amplifier A1 and ground is shown in Equations 1 and 2:

$$I1 = \frac{1}{Res1}(V_{be2} - V_{be1}) = \frac{1}{Res1} V_T \ln\left(\frac{n}{m}\right) \quad \text{Equation 1}$$

$$N = \left(\frac{n}{m}\right) \quad \text{Equation 2}$$

Res1 is the resistance of R1. $V_{be2}$ is the base-emitter junction voltage of Q2. $V_{be1}$ is the base-emitter junction voltage of Q1. $V_T$ is the thermal voltage of Q1 and Q2. The "ln" is an abbreviation for "natural log." The "n" is the number of BJT unit cells included in Q1. The "m" is the number of BJT unit cells included in Q2. N is a ratio of n to m. I1 is the current flowing through R1. The current I1 is mirrored to the first current branch CB1 to generate a current I2 and to the second current branch CB2 to generate a current I3. The current I2 flows through R2 to generate the voltage IR2 and the second current I3 flows through the BJT Q3 to generate the voltage $V_{be3}$. $V_{be3}$ is the base-emitter junction voltage of Q3. The voltage IR2 is a PTAT voltage. That is, the voltage IR2 has a positive temperature coefficient. This is because the voltage IR2 is proportional to the thermal voltage, and the thermal voltage has a positive temperature coefficient. The voltage $V_{be3}$ is a CTAT voltage. That is, the voltage $V_{be3}$ has a negative temperature coefficient. This is because BJTs have a negative temperature coefficient. The resistors R3 and R4 receive the voltages IR2 and $V_{be3}$, respectively, to generate, at the node BGR, a voltage $V_{BGR}$ that is equal to weighted sum of the PTAT and CTAT voltages as is shown in equation 3, which is based on Kirchhoff's voltage laws and Kirchhoff's current laws. The weighted sum can be adjusted by selecting values of the resistors R3 and R4. For example, for large values (e.g., greater than 100 k ohms) of R4 and small values of R3 (e.g., less than 10 k ohms), voltage $V_{BGR}$ is a PTAT voltage, and for large values of R3 and small values of R4, voltage $V_{BGR}$ is a CTAT voltage. In some embodiments, the resistors R3 and R4 are configured such that the positive temperature coefficient of the voltage IR2 cancels or substantially cancels with the negative temperature coefficient of the voltage $V_{be3}$ to generate a zero or near-zero temperature coefficient voltage at the node BGR. The following equation reflects the relationship between the weighted sum and the PTAT and CTAT voltages:

$$V_{BGR} = \frac{R4}{R3+R4} IR2 + \frac{R3}{R3+R4} V_{be3} \qquad \text{Equation 3}$$

Each MOSFET device can be a p-type MOSFET (a PMOS device), a silicon-on-insulate (SOI) MOSFET, a FinFET, or any other device suitable for use in band gap reference circuits. In some embodiments, the mirroring device can be an n-type MOSFET (an NMOS device) connected to ground instead of a PMOS device connected to a power rail. A PMOS device may be advantageous for such applications because the PMOS device can incur less loss than an NMOS device to couple to a power rail. An NMOS device can be chosen for the MOSFET device for applications where speed is a concern because, in some embodiments, read and write operations are faster using an NMOS device than using a PMOS device. Specifically, in some embodiments, the mobility of electrons, which are carriers in the case of an NMOS device, is about two times greater than that of holes, which are the carriers of the PMOS device. A PMOS device can be chosen for the MOSFET device for applications where variation, cost, or noise is a concern because, in some embodiments, PMOS technology is highly controllable, low-cost process with good yield and high noise immunity as compared to NMOS technology.

The MOSFET device can be any of various transistor types while remaining within the scope of the present disclosure. The MOSFET device can have a MOSFET device type of standard threshold voltage (SVT), low threshold voltage (LVT), high threshold voltage (HVT), high voltage (HV), input/output (TO), or any of various other MOS device types.

In some embodiments, operation of bandgap reference circuit 100 can include one or more of the following operations. A voltage supply signal, which can be referred to as VDD, may be applied to the source terminals of M1, M2, M3, M4, and the voltage supply terminal of the operational amplifier A1. Based on the bias configuration described above, a current I1 may be generated across the resistor R1. The current I1 may be mirrored to generate the current I2 through the current branch CB1, and the current I3 through the current branch CB2. Based on Kirchhoff's voltage law and Kirchoff's current law, the currents I1 and I2 may generate a voltage $V_{BGR}$ at the node BGR, in accordance with Equation 3 above.

Figure 2:
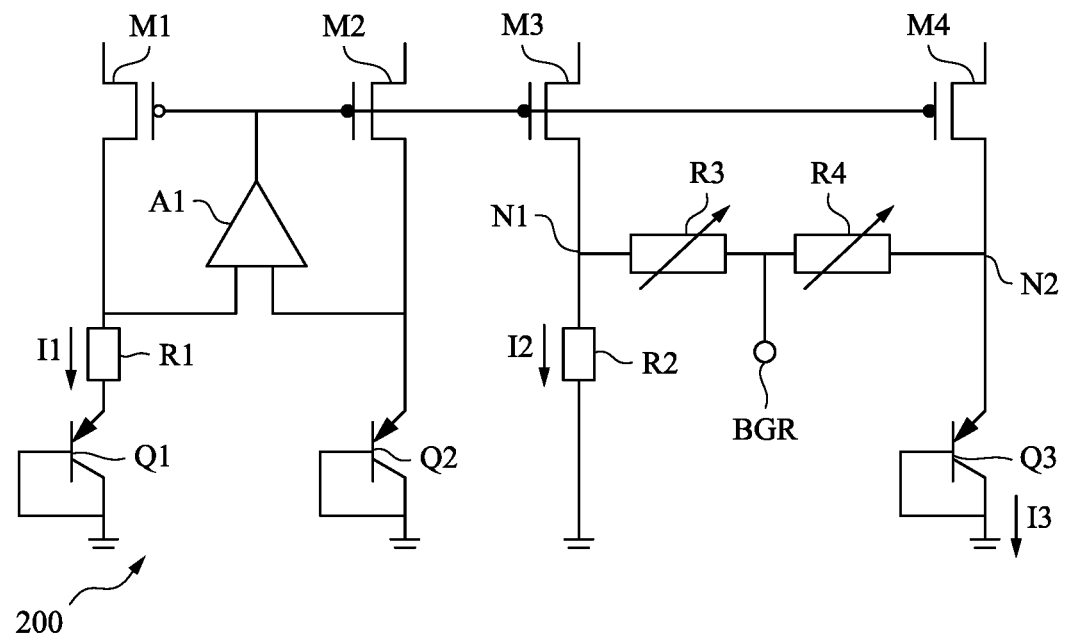
FIG. 2 illustrates a variable-resistor bandgap voltage reference circuit, in accordance with some embodiments of the present disclosure.

FIG. 2 illustrates a bandgap reference circuit 200, in accordance with some embodiments of the present disclosure. The bandgap reference circuit 200 is similar to the bandgap reference circuit 100 of FIG. 1 except that the bandgap reference circuit 200 includes variable resistors R3 and R4. Advantageously, the variable resistors R3 and R4 of the bandgap reference circuit 200 can be adjusted to get a desired temperature coefficient. For example, for large values of R4 and small values of R3, voltage $V_{BGR}$ is a PTAT voltage, and for large values of R3 and small values of R4, voltage $V_{BGR}$ is a CTAT voltage.

The resistors R3 and R4 in the bandgap reference circuit 200 are variable resistors. In some embodiments, the resistor R3 includes a plurality of resistors. In some embodiments, R3 includes a first resistor in parallel with a series combination of a second resistor and a switch. When the switch is closed in order for current to flow through the switch, the total resistance of R3 is equal to or substantially equal to the parallel combination of the first resistor and the second resistor. When the switch is open in order to prevent current from flowing through the switch, the total resistance of the R3 is equal to or substantially equal to the first resistance. In some embodiments, the resistor R3 is a potentiometer, a rheostat, a digital resistor, or any other device that is characterized by a variable resistance, without departing from the scope of the present disclosure. While only the resistor R3 is described, it is understood that the description can apply, additionally or alternatively, to one or more of the resistors R1, R2, or R4 without departing from the scope of the present disclosure.

Figure 3A:
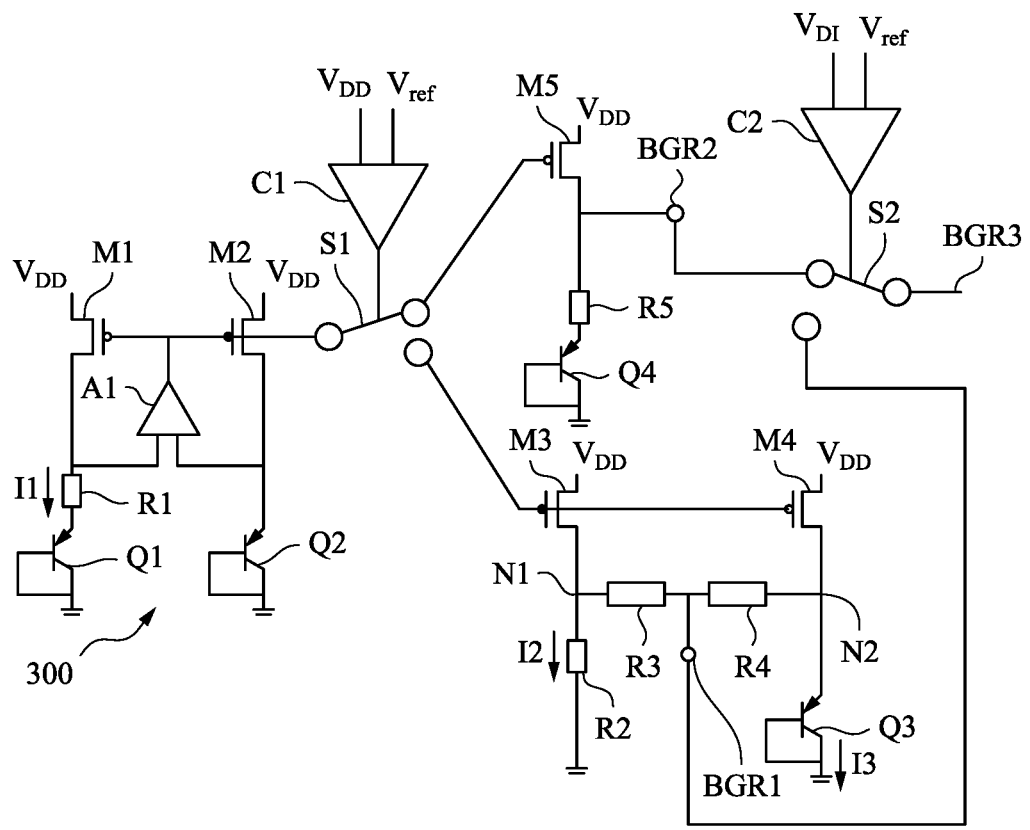
FIG. 3A illustrates a reconfigurable bandgap voltage reference circuit, in accordance with some embodiments of the present disclosure.

FIG. 3A illustrates a bandgap reference circuit 300, in accordance with some embodiments of the present disclosure. The bandgap reference circuit 300 is similar to the bandgap reference circuit 100 except that the bandgap reference circuit 300 is a reconfigurable bandgap reference circuit. Advantageously, the bandgap reference circuit 300 can be configured to a first configuration for low supply voltages and a second configuration for high supply voltages.

The bandgap reference circuit 300 includes a switch S1 that includes an input signal port coupled to the output terminal of amplifier A1 and a first output signal port coupled to the gate terminals of the MOSFET devices M3 and M4. In other words, the coupling of the MOSFET devices M3 and M4 to the amplifier A1 can only be via the switch S1 and not directly coupled as in the bandgap reference circuit 100 of FIG. 1.

In some embodiments, the switch S1 includes a second output signal port coupled to a gate terminal of a MOSFET device M5. The source terminal of the MOSFET device M5 is coupled to the voltage supply $V_{DD}$. The drain terminal of the MOSFET device M5 is coupled to a first terminal of a resistor R5. A second terminal of the resistor R5 is coupled to an emitter terminal of a BJT Q4. A base terminal and a collector terminal of the BJT Q4 are coupled to ground. An output node BGR2 is coupled to the drain terminal of MOSFET device M5. The MOSFET device M5, the resistor R5, and the BJT Q4 may be collectively referred to as a third current branch.

A current flows through the third current branch based on a voltage at the gate terminal of the MOSFET device M5. The current generates a PTAT voltage across R5 and a CTAT voltage across Q4. The output node BGR2 provides a sum of the voltages of the PTAT and CTAT voltages. In some embodiments, the temperature coefficients of the PTAT voltage and the CTAT voltage cancel, or substantially cancel, to generate a zero or near-zero temperature coefficient voltage at the node BGR2.

In some embodiments, the bandgap reference circuit 300 includes a switch S2 that includes a first input signal port coupled to the output node BGR1, a second input signal port coupled to the output node BGR2, and a signal output port coupled to the output node BGR3. In some embodiments, BGR3 receives the selected bandgap reference voltage.

In some embodiments, there are two valid states of operation for the bandgap reference circuit 300. It is understood that, for purposes of discussion, the "signal path" includes the components that are coupled to the switches S1 and S2. The first valid state of operation is to configure S1 to couple the input signal port of S1 to the first output signal port of S1 and to configure S2 to couple the first input signal port of S2 to the signal output port of S2. In this state of operation, the portion of the circuit coupled to the input signal port of S1 (i.e., the operational amplifier A1, etc.) is same as the corresponding components in the bandgap reference circuit 100, and the remaining components in the signal path (i.e., the transistor M5, etc.) are different from the bandgap reference circuit 100. The second valid state of operation is to configure S1 to couple the input signal port of S1 to the second output signal port of S1 and to configure S2 to couple the second input signal port of S2 to the signal output port of S2. In this state of operation, all of the components in the signal path (i.e., the operational amplifier A1, the transistor M3, etc.) are same as the corresponding components in the bandgap reference circuit 100. In both states of operation, BGR3 of the bandgap reference circuit 300 corresponds to BGR of the bandgap reference circuit 100.

In some embodiments, the bandgap reference circuit 300 includes a comparator C1 that includes an output port coupled to a control port of the switch S1. In some embodiments, the comparator C1 includes a first input port and a second input port. The first input port receives a supply voltage VDD and the second signal port receives a reference voltage $V_{ref}$. In some embodiments, a comparator C2 is coupled to a control port of the switch S2. C2 may be similar to C1. In some embodiments, the same comparator (C1) is used for both the switch S1 and the switch S2. The comparator C1 works by comparing a first signal (e.g., VDD) at its first input port and a second signal (e.g., Vref) at its second input port and selecting an output signal based on which of the first signal and the second signal has a greater magnitude, such that the portion of the bandgap reference circuit 300 that is different than in the bandgap reference circuit 100 is selected for the signal path if VDD >Vref, and the portion of the bandgap reference circuit 300 that is same as in the bandgap reference circuit 100 is selected for the signal path if VDD <Vref.

Figure 3B:
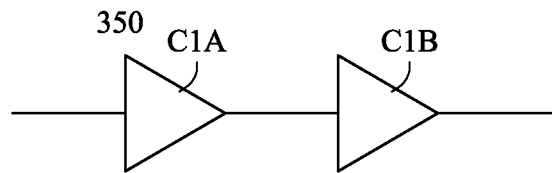
FIG. 3B illustrates a two-stage comparator, in accordance with some embodiments of the present disclosure.

In some embodiments, the comparators C1 and C2 are implemented as a single-stage operational amplifier including a differential amplifier. In some embodiments, each of the comparators C1 and C2 is implemented as a two-stage operational amplifier 350, as shown in FIG. 3B. The two stages can include the differential amplifier CIA, followed by a voltage gain amplifier C1B. The comparators C1 and C2 can be implemented using MOSFET devices. Although the operational amplifier 350 is depicted as a two-stage operational amplifier, the operational amplifier 350 can include any various number of stages. For example, the operational amplifier 350 can be a three-stage amplifier. The three stages may include the above stages, followed by a buffer stage that provides a gain to the current.

In operation, the comparator C1 of the bandgap reference circuit 300 provides a first signal at its first output port if the supply voltage $V_{DD}$ at the first input port is greater than the reference voltage $V_{ref}$ at the second input port. In response to receiving the first signal, the switch S1 couples the amplifier A1 to the MOSFET device M5 and does not couple the amplifier A1 to the MOSFET devices M3 and M4.

The comparator C2 of the bandgap reference circuit 300 provides a second signal at its first output port if the supply voltage $V_{DD}$ at the first input port is greater than the reference voltage $V_{ref}$ at the second input port. In response to receiving the second signal, the switch S2 couples the node BGR2 to the node BGR3 and does not couple node BGR to the node BGR3.

The comparator C1 of the bandgap reference circuit 300 provides a third signal at its first output port if the supply voltage $V_{DD}$ at the first input port is less than the reference voltage $V_{ref}$ at the second input port. In response to receiving the third signal, the switch S1 couples the amplifier A1 to the MOSFET devices M3 and M4 and does not couple the amplifier A1 to the MOSFET device M5.

The comparator C2 of the bandgap reference circuit 300 provides a fourth signal at its first output port if the supply voltage $V_{DD}$ at the first input port is less than the reference voltage $V_{ref}$ at the second input port. In response to receiving the fourth signal, the switch S2 couples the node BGR to the node BGR3 and does not couple node BGR2 to the node BGR3.

Figure 4:
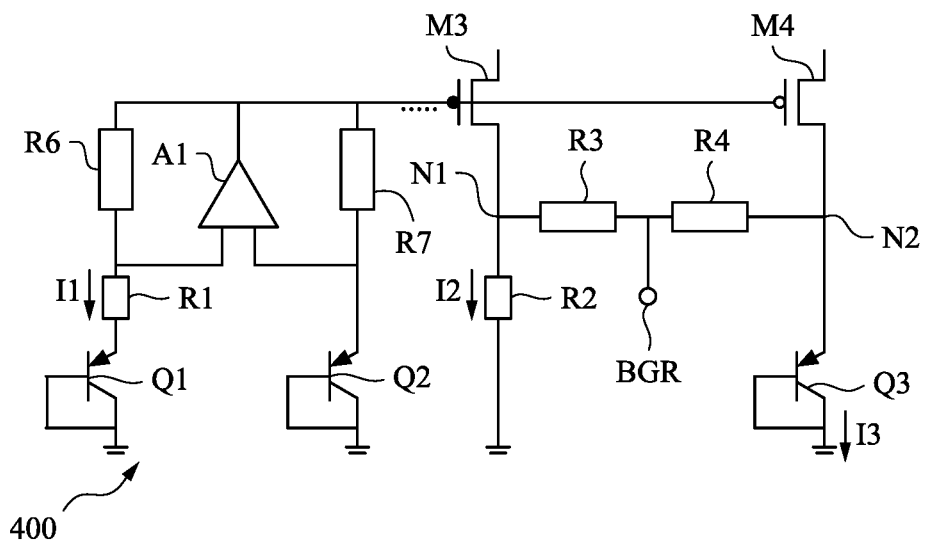
FIG. 4 illustrates another bandgap voltage reference circuit, in accordance with some embodiments of the present disclosure.

FIG. 4 illustrates a bandgap reference circuit 400, in accordance with some embodiments of the present disclosure. The bandgap reference circuit 400 feeds the output of the operational amplifier A1 back through resistors instead of through MOSFET devices. One advantage of the bandgap reference circuit 400 is that, by removing M1 and M2, there is sufficient voltage headroom for the current branches that are coupled to the drains of M1 and M2. However, the bandgap reference circuit 400 provides less isolation between the output of the operational amplifier A1 and the input of the operation amplifier A1.

The bandgap reference circuit 400 includes a resistor R6 that is coupled between the output terminal of the amplifier A1 and the first input of the amplifier A1. The bandgap reference circuit 400 includes a resistor R7 that is coupled between the output of the amplifier A1 and second input of the amplifier A1. R6 and R7 can function as passive versions of M1 and M2 of FIG. 1, which provide isolation between the input and the output of the operational amplifier A1. R6 and R7 can be selected to provide a similar voltage drop to the drain-gate junctions of M1 and M2, respectively.

Figure 5:
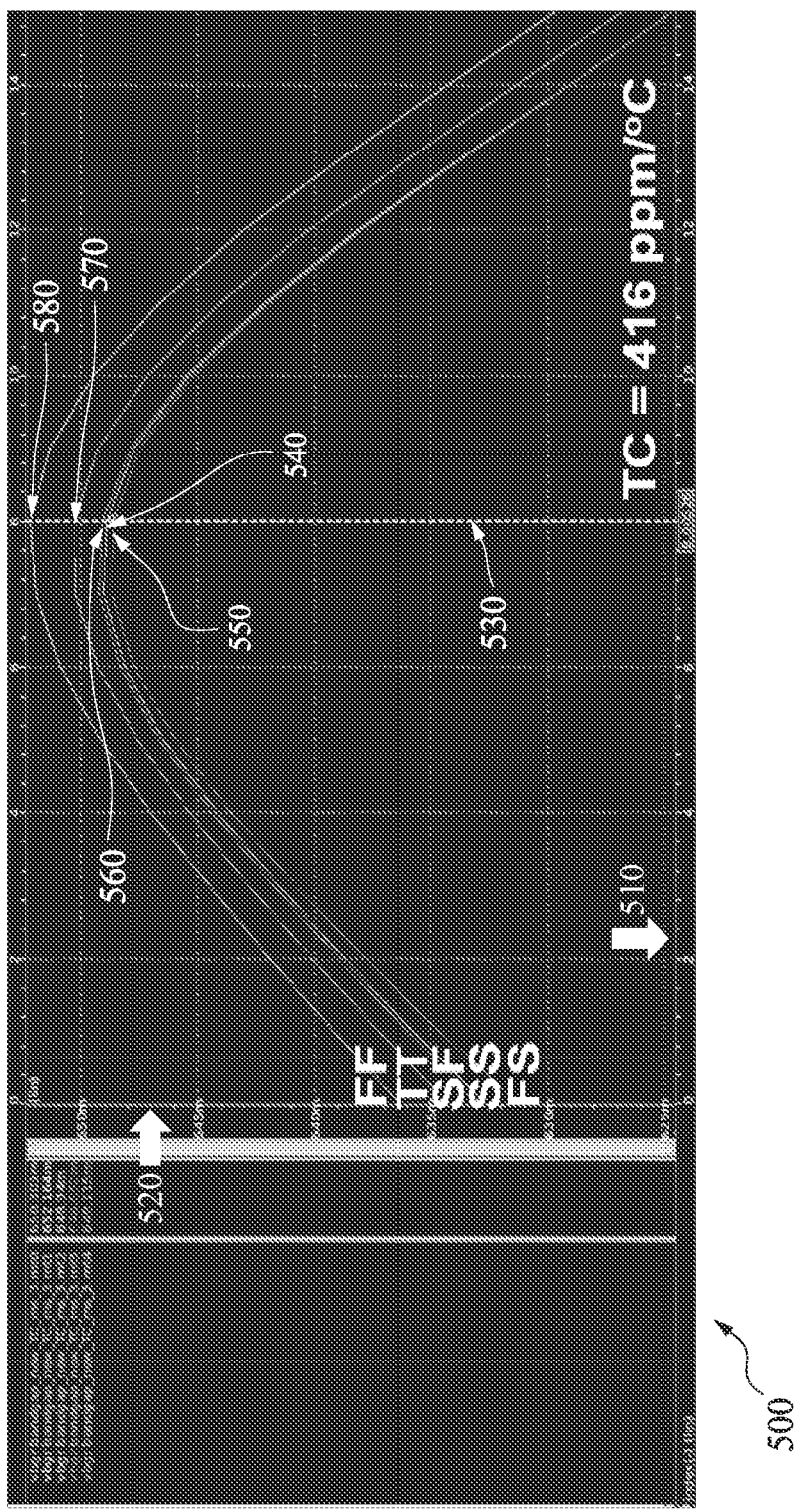
FIG. 5 illustrates a voltage-temperature plot of varying bandgap reference voltages, in accordance with some embodiments of the present disclosure.

FIG. 5 illustrates a voltage-temperature plot 500 of varying bandgap reference voltages, in accordance with some embodiments of the present disclosure. In some embodiments, the bandgap voltage is less than 750 millivolts. In some embodiments, the bandgap voltage has a temperature coefficient less than 1000 parts-per-million per degree Celsius. The x-axis 510 is the temperature in Celsius. The y-axis 520 is the bandgap reference voltage. The vertical line 530 is at eight degrees Celsius.

The voltage curves show that, using the bandgap reference circuit 100 of FIG. 1, the temperature coefficient (about 416 parts-per-million (ppm) per degree Celsius) is comparable to conventional techniques while running the bandgap reference circuit 100 at a lower supply voltage than in conventional techniques. The voltage curve 540 shows a bandgap reference voltage versus temperature for a fast-slow (FS) process. The voltage curve 540 shows that the bandgap reference manufactured in a FS process has a voltage of 648.7 millivolts at eight degrees Celsius. The voltage curve 550 shows a bandgap reference voltage versus temperature for a slow-slow (SS) process. The voltage curve 550 shows that the bandgap reference manufactured in a SS process has a voltage of 648.9 millivolts at eight degrees Celsius. The voltage curve 560 shows a bandgap reference voltage versus temperature for a slow-fast (SF) process. The voltage curve 560 shows that the bandgap reference manufactured in a SF process has a voltage of 649.1 millivolts at eight degrees Celsius. The voltage curve 570 shows a bandgap reference voltage versus temperature for a typical-typical (TT) process. The voltage curve 570 shows that the bandgap reference manufactured in a TT process has a voltage of 650.3 millivolts at eight degrees Celsius. The voltage curve 580 shows a bandgap reference voltage versus temperature for a fast-fast (FF) process. The voltage curve 580 shows that the bandgap reference manufactured in a FF process has a voltage of 652.2 millivolts at eight degrees Celsius. The voltage-temperature plot 500 shows that the temperature coefficient at the vertical line 530 is about 416 parts-per-million (ppm) per degree Celsius.

Figure 6:
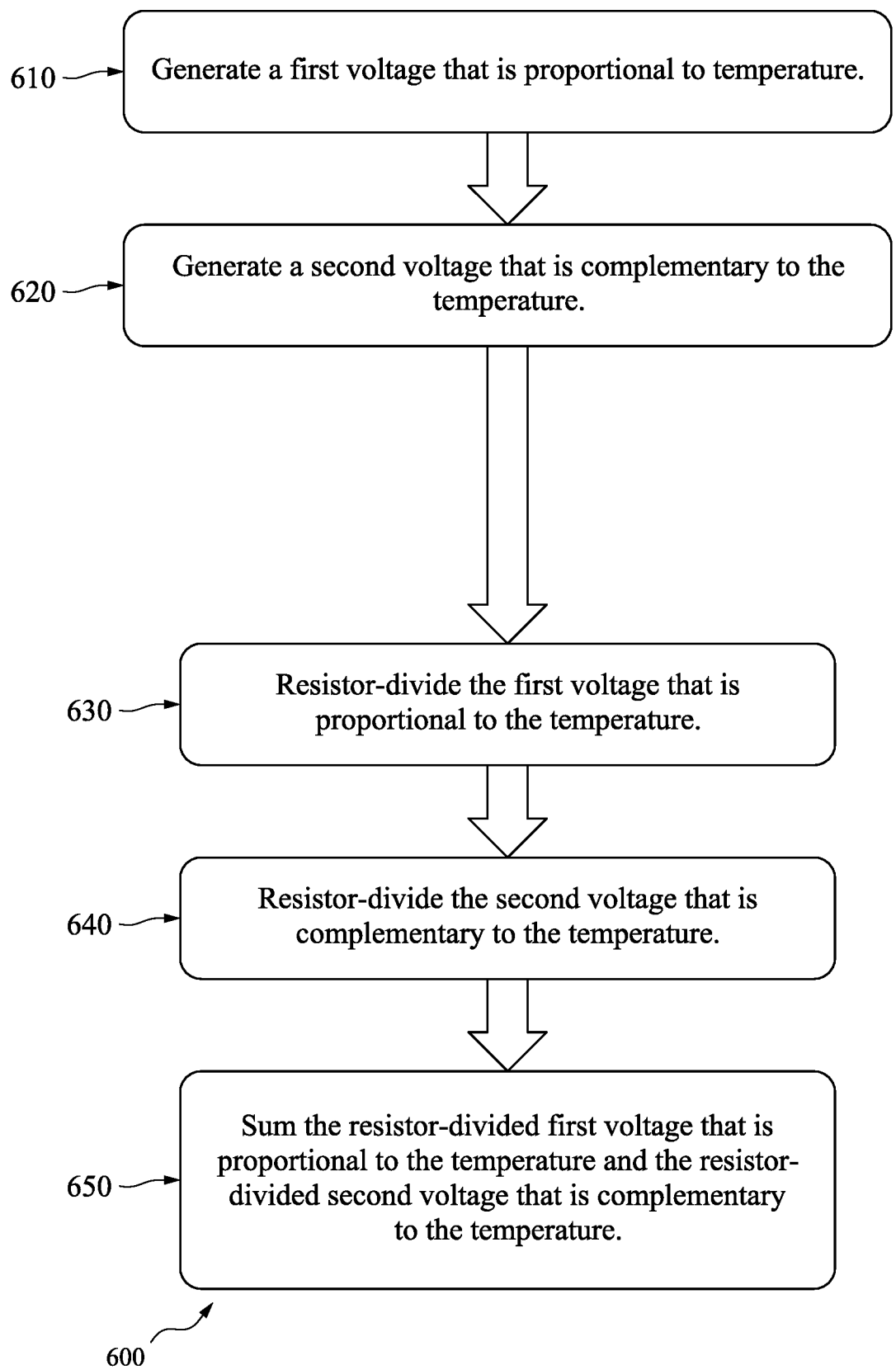
FIG. 6 illustrates a flowchart of a method of operation of the bandgap reference circuit, in accordance with some embodiments of the present disclosure.

FIG. 6 illustrates a flowchart of a method 600 of operation of a bandgap reference circuit, in accordance with some embodiments of the present disclosure. It is noted that the method 600 is merely an example and is not intended to limit the present disclosure. Accordingly, it is understood that additional operations may be provided before, during, and after the method 600 of FIG. 6, and that some other operations may only be briefly described herein. In some embodiments, the method 600 is performed by one or more of the bandgap reference circuit 100, the bandgap reference circuit 200, the bandgap reference circuit 300, or the bandgap reference circuit 400.

In brief overview, the bandgap reference circuit (e.g., the bandgap reference circuit 100 of FIG. 1) generates a first voltage (e.g., IR2) that is proportional to the temperature (610). The bandgap reference circuit generates a second voltage (e.g., Vbe3) that is complementary to the temperature (620). The bandgap reference circuit resistor-divides the first voltage that is proportional to temperature (630). The bandgap reference circuit resistor divides the second voltage that is complementary to the temperature (640). The bandgap reference circuit sums the resistor-divided first voltage that is proportional to the temperature and the resistor-divided second voltage that is complementary to the temperature to generate a bandgap voltage (e.g., a voltage at node BGR) (650).

In more detail, at operation 610, the bandgap reference circuit (e.g., the bandgap reference circuit 100 of FIG. 1) generates a first voltage (e.g., IR2, which is the voltage at node N1 of FIG. 1) that is proportional to the temperature. In some embodiments, the first voltage is generated by mirroring another voltage (e.g., I1 of FIG. 1) to the current branch (e.g., CB1 of FIG. 1) to generate a first current (e.g., the current I2 of FIG. 1), which flows through a first current mirror (e.g., the MOSFET M3 of FIG. 1) and a resistor (e.g., the resistor R2 of FIG. 1).

At operation 620, the bandgap reference circuit generates a second voltage (e.g., Vbe3, which is the voltage at node N2 of FIG. 1) that is complementary to the temperature. In some embodiments, the second voltage is generated by mirroring the other voltage (e.g., I1 of FIG. 1) to the current branch (e.g., CB2 of FIG. 1) to generate a second current (e.g., the current I3 of FIG. 1), which flows through a second current mirror (e.g., the MOSFET M4 of FIG. 1) and the emitter-collector junction of a BJT (e.g., the BJT Q3 of FIG. 1).

Operations 630-650 describe how the bandgap reference circuit provides a bandgap voltage. At operation 630, the bandgap reference circuit resistor-divides the first voltage (e.g., IR2 of FIG. 1) that is proportional to temperature. In some embodiments, the resistor-divided first voltage (e.g., $V_{BGR,CB1}$) is the first voltage multiplied by a resistance of a first resistor (e.g., the resistor R4 of FIG. 1) and divided by a sum of the resistance of the first resistor and a resistance of a second resistor (e.g., the resistor R3 of FIG. 1), as described by Equation 4, which is illustrated below:

$$V_{BGR,CB1} = \frac{R4}{R3+R4} IR2 \qquad \text{Equation 4}$$

At operation 640, the bandgap reference circuit resistor divides the second voltage (e.g., Vbe3) that is complementary to the temperature. In some embodiments, the resistor-divided second voltage (e.g., $V_{BGR,CB2}$) is the second voltage multiplied by the resistance of the second resistor (e.g., the resistor R3 of FIG. 1) and divided by a sum of the resistance of the first resistor (e.g., the resistor R4 of FIG. 1) and the resistance of a second resistor, as described by Equation 4, which is illustrated below:

$$V_{BGR,CB2} = \frac{R3}{R3+R4} V_{be3} \qquad \text{Equation 5}$$

At operation 650, the bandgap reference circuit sums the resistor-divided first voltage (e.g., $V_{BGR,CB1}$) that is proportional to the temperature and the resistor-divided second voltage (e.g., $V_{BGR,CB2}$) that is complementary to the temperature to generate the bandgap voltage (e.g., $V_{BGR}$ of FIG. 1), as shown in Equation 6, which is illustrated below. In some embodiments, the bandgap reference circuit generates a bandgap voltage less than 750 millivolts. In some embodiments, the bandgap reference circuit generates a bandgap voltage that has a temperature coefficient less than 1000 parts-per-million per degree Celsius.

$$V_{BGR} = V_{BGR,CB1} + V_{BGR,CB2} \qquad \text{Equation 6:}$$

In one aspect, a bandgap reference circuit includes a first current mirror to receive a bias voltage and provide a first current. The bandgap reference circuit includes a first resistor coupled to the first current mirror to receive the first current and provide a proportional to absolute temperature (PTAT) voltage. The bandgap reference circuit includes a second current mirror to receive the bias voltage and provide a second current. The bandgap reference circuit includes a bipolar junction transistor (BJT) device coupled to the second current mirror to receive the second current and provide a complementary to the absolute temperature (CTAT) voltage. The bandgap reference circuit includes an output node to provide a bandgap voltage that is a weighted sum of the PTAT voltage and the CTAT voltage. The bandgap reference circuit includes a second resistor coupled in between the output node and a first node. In some embodiments, the first node is coupled in between the first resistor and the first current mirror. The bandgap reference circuit includes a third resistor coupled in between the output node and a second node. In some embodiments, the second node is coupled in between the BJT device and the second current mirror.

In some embodiments, at least one of the second resistor and the third resistor comprises a fourth resistor in parallel with a series combination of a fifth resistor and a switch. In some embodiments, the bandgap reference circuit includes an amplifier coupled to the first current mirror and the second current mirror to provide the bias voltage. In some embodiments, the switch includes a first signal port and a second signal port, wherein the first signal port is coupled to the amplifier. In some embodiments, the second signal port is coupled to the first current mirror and the second current mirror.

In some embodiments, the switch comprises a third signal port coupled to a third current mirror. In some embodiments, the bandgap reference circuit further includes a comparator comprising an output port that is coupled to a control port of the switch. In some embodiments, the comparator includes a first input port and a second input port, wherein the first input port receives a supply voltage, and the second input port receives a reference voltage. In some embodiments, the bandgap voltage is less than 750 millivolts. In some embodiments, the bandgap voltage has a temperature coefficient less than 1000 parts-per-million per degree Celsius. In some embodiments, a ratio of a resistance of the second resistor and a resistance of the first resistor is greater than ten.

In some embodiments, the bandgap reference circuit includes an amplifier coupled to the first current mirror and the second current mirror to provide the bias voltage. In some embodiments, the bandgap reference circuit includes a fourth resistor coupled to a first input of the amplifier, a second BJT coupled to the fourth resistor, and a third BJT coupled to a second input of the amplifier. In some embodiments, the amplifier is a two-stage operational amplifier. In some embodiments, the amplifier is a three-stage operational amplifier. In some embodiments, the fourth resistor includes a fifth resistor in parallel with a series combination of a sixth resistor and a switch. In some embodiments, an emitter area of the second BJT is at least two times as large as an emitter area of the first BJT.

In some embodiments, the bandgap reference circuit includes a first metal oxide semiconductor field effect transistor (MOSFET) device comprising a first port and a second port, wherein the first port is coupled to an output of the amplifier, and wherein the second port is coupled to the first input of the amplifier. In some embodiments, the bandgap reference circuit includes a second MOSFET device comprising a third port and a fourth port, wherein the third port is coupled to the output of the amplifier, and wherein the fourth port is coupled to the second input of the amplifier. In some embodiments, the bandgap reference circuit includes a fifth resistor coupled in between an output of the amplifier and the first input of the amplifier, and a sixth resistor coupled in between the output of the amplifier and the second input of the amplifier.

In one aspect, a bandgap reference circuit includes an amplifier to provide a bias voltage. The bandgap reference circuit includes a first current branch coupled to the amplifier to receive the bias voltage and provide a first current. The first current branch includes a first p-type metal-oxide-semiconductor (PMOS) device coupled to the amplifier, and a first resistor coupled to the first PMOS device to receive the bias voltage and provide a proportional to absolute temperature (PTAT) voltage. The bandgap reference circuit includes a second current branch coupled to the amplifier to receive the bias voltage and provide a second current. The second current branch includes a second PMOS device coupled to the amplifier, and a bipolar junction transistor (BJT) device coupled to the second PMOS device to provide a complementary to the absolute temperature (CTAT) voltage. The bandgap reference circuit includes a pair of resistors coupled in between the first current branch and the second current branch. The pair of resistors include a second resistor coupled to the first current branch, and a third resistor coupled to the second current branch. The pair of resistors include an output node coupled in between the second resistor and the third resistor to provide a bandgap voltage that is a weighted sum of the PTAT voltage and the CTAT voltage. In some embodiments, the bandgap reference circuit that includes an amplifier has a bandgap voltage less than 750 millivolts.

In one aspect, a method to provide a bandgap reference includes generating a first voltage that is proportional to temperature, generating a second voltage that is complementary to the temperature, and providing a bandgap voltage. The method to provide a bandgap voltage includes resistor-dividing the first voltage that is proportional to the temperature. The method to provide a bandgap voltage includes resistor-dividing the second voltage that is complementary to the temperature. The method to provide a bandgap voltage includes summing the resistor-divided first voltage that is proportional to the temperature and the resistor-divided second voltage that is complementary to the temperature. In some embodiments, the method to provide a bandgap reference includes mirroring a first current to a second current and a third current. In some embodiments, the method to provide a bandgap reference includes generating the first voltage that is proportional to the temperature based on the second current. In some embodiments, the method to provide a bandgap reference includes generating the second voltage that is complementary to the temperature based on the third current.

What is claimed is:

1. A bandgap reference circuit comprising:
a first current mirror to receive a bias voltage and provide a first current;
a first resistor coupled to the first current mirror to receive the first current and provide a proportional to absolute temperature (PTAT) voltage;
a second current mirror to receive the bias voltage and provide a second current;
a bipolar junction transistor (BJT) device coupled to the second current mirror to receive the second current and provide a complementary to the absolute temperature (CTAT) voltage;
an output node to provide a bandgap voltage that is a weighted sum of the PTAT voltage and the CTAT voltage;
a second resistor coupled in between the output node and a first node, wherein the first node is coupled in between the first resistor and the first current mirror;
a third resistor coupled in between the output node and a second node, wherein the second node is coupled in between the BJT device and the second current mirror;
an amplifier coupled to the first current mirror and the second current mirror to provide the bias voltage; and
a switch comprising a first signal port and a second signal port, wherein the first signal port is coupled to the amplifier, and wherein the second signal port is coupled to the first current mirror and the second current mirror.

2. The bandgap reference circuit of claim 1, wherein at least one of the second resistor and the third resistor comprises variable resistor.

3. The bandgap reference circuit of claim 1, wherein the switch comprises a third signal port coupled to a third current mirror.

4. The bandgap reference circuit of claim 3, further comprising a comparator comprising an output port that is coupled to a control port of the switch.

5. The bandgap reference circuit of claim 4, wherein the comparator comprises a first input port and a second input port, wherein the first input port receives a supply voltage, and the second input port receives a reference voltage.

6. The bandgap reference circuit of claim 1, wherein the bandgap voltage is less than 750 millivolts.

7. The bandgap reference circuit of claim 1, wherein the bandgap voltage has a temperature coefficient less than 1000 parts-per-million per degree Celsius.

8. The bandgap reference circuit of claim 1, wherein a ratio of a resistance of the second resistor and a resistance of the first resistor is greater than ten.

9. The bandgap reference circuit of claim 1, wherein the BJT device is a first BJT, and further comprising:
a fourth resistor coupled to a first input of the amplifier;

a second BJT coupled to the fourth resistor; and
a third BJT coupled to a second input of the amplifier.

10. The bandgap reference circuit of claim 9, wherein the amplifier is a two-stage operational amplifier.

11. The bandgap reference circuit of claim 9, wherein the amplifier is a three-stage operational amplifier.

12. The bandgap reference circuit of claim 9, wherein the fourth resistor comprises a variable resistor.

13. The bandgap reference circuit of claim 9, wherein an emitter area of the second BJT is at least two times as large as an emitter area of the first BJT.

14. The bandgap reference circuit of claim 9, further comprising:
a first metal oxide semiconductor field effect transistor (MOSFET) device comprising a first port and a second port, wherein the first port is coupled to an output of the amplifier, and wherein the second port is coupled to the first input of the amplifier; and
a second MOSFET device comprising a third port and a fourth port, wherein the third port is coupled to the output of the amplifier, and wherein the fourth port is coupled to the second input of the amplifier.

15. The bandgap reference circuit of claim 9, further comprising:
a fifth resistor coupled in between an output of the amplifier and the first input of the amplifier; and
a sixth resistor coupled in between the output of the amplifier and the second input of the amplifier.

16. A bandgap reference circuit comprising:
an amplifier to provide a bias voltage;
a first current branch coupled to the amplifier to receive the bias voltage and provide a first current, the first current branch comprising:
a first p-type metal-oxide-semiconductor (PMOS) device coupled to the amplifier; and
a first resistor coupled to the first PMOS device to receive the bias voltage and provide a proportional to absolute temperature (PTAT) voltage;
a second current branch coupled to the amplifier to receive the bias voltage and provide a second current, the second current branch comprising:
a second PMOS device coupled to the amplifier; and
a bipolar junction transistor (BJT) device coupled to the second PMOS device to provide a complementary to the absolute temperature (CTAT) voltage; and
a pair of variable resistors coupled in between the first current branch and the second current branch, the pair of variable resistors comprising:
a first variable resistor coupled to the first current branch;
a second variable resistor coupled to the second current branch; and
an output node coupled in between the first variable resistor and the second variable resistor to provide a bandgap voltage that is a weighted sum of the PTAT voltage and the CTAT voltage.

17. The bandgap reference circuit of claim 16, wherein the bandgap voltage is less than 750 millivolts.

18. A method to provide a bandgap reference, the method comprising:
generating a first voltage that is proportional to temperature;
generating a second voltage that is complementary to the temperature; and
providing a bandgap voltage by:
resistor-dividing, using a first variable resistor, the first voltage that is proportional to the temperature;
resistor-dividing, using a second variable resistor, the second voltage that is complementary to the temperature; and
summing the resistor-divided first voltage that is proportional to the temperature and the resistor-divided second voltage that is complementary to the temperature.

19. The method of claim 18, further comprising:
mirroring a first current to a second current and a third current;
generating the first voltage that is proportional to the temperature based on the second current; and
generating the second voltage that is complementary to the temperature based on the third current.

* * * * *